(12) United States Patent
Huang et al.

(10) Patent No.: US 10,236,375 B2
(45) Date of Patent: Mar. 19, 2019

(54) HIGH VOLTAGE METAL OXIDE SEMICONDUCTOR DEVICE AND MANUFACTURING METHOD THEREOF

(71) Applicant: RICHTEK TECHNOLOGY CORPORATION, Zhubei, HsinChu (TW)

(72) Inventors: Tsung-Yi Huang, HsinChu (TW); Chu-Feng Chen, Hsinchu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/889,051

(22) Filed: Feb. 5, 2018

(65) Prior Publication Data

US 2018/0331211 A1 Nov. 15, 2018

(30) Foreign Application Priority Data

May 11, 2017 (TW) .............................. 106115549 A (51) Int. Cl.
| | |
|---|---|
| *H01L 29/78* | (2006.01) |
| *H01L 29/10* | (2006.01) |
| *H01L 29/08* | (2006.01) |
| *H01L 29/06* | (2006.01) |
| *H01L 29/66* | (2006.01) |

(Continued)

(52) U.S. Cl.
CPC ...... *H01L 29/7816* (2013.01); *H01L 29/0649* (2013.01); *H01L 29/0653* (2013.01); *H01L 29/0865* (2013.01); *H01L 29/0882* (2013.01); *H01L 29/1095* (2013.01); *H01L 29/66659* (2013.01); *H01L 29/66681* (2013.01); *H01L 29/7835* (2013.01); *H01L 21/266* (2013.01); *H01L 21/26513* (2013.01); *H01L 21/76202* (2013.01); *H01L 21/76224* (2013.01)

(58) Field of Classification Search
None
See application file for complete search history.

(56) References Cited

U.S. PATENT DOCUMENTS

2012/0286359 A1* 11/2012 Lin ..................... H01L 29/1045
257/335
2012/0299093 A1* 11/2012 Kim ....................... H01L 29/00
257/335

(Continued)

*Primary Examiner* — Eduardo A Rodela
*Assistant Examiner* — Nilufa Rahim
(74) *Attorney, Agent, or Firm* — Tung & Associates (57) ABSTRACT

A high voltage MOS device includes: a well region with a first conductive type, a body region with a second conductive type, a gate, plural source regions with the first conductive type, a drain region with the first conductive type, and a body contact region with the second conductive type. The plural source regions contact the gate, and are substantially arranged in parallel along a width direction, and each two neighboring source regions are not contacted with each other. The body connection region extends along the width direction and overlaps with at least two of the source regions, such that the body connection region includes at least a first region and a second region, wherein the first region overlaps with at least one of the source regions, and the second region does not overlap any of the regions. The contact region does not contact the gate along a lateral direction.

6 Claims, 11 Drawing Sheets

(51) Int. Cl.
  *H01L 21/265* (2006.01)
  *H01L 21/762* (2006.01)
  *H01L 21/266* (2006.01)

(56) References Cited

U.S. PATENT DOCUMENTS

| | | | |
|---|---|---|---|
| 2013/0069153 A1 | 3/2013 | Huang et al. | |
| 2013/0341705 A1* | 12/2013 | Raghavan | H01L 29/1095 257/328 |
| 2014/0332901 A1* | 11/2014 | Yang | H01L 29/7833 257/401 |
| 2015/0079755 A1 | 3/2015 | Kao et al. | |
| 2016/0284841 A1* | 9/2016 | Min | H01L 29/1033 |

* cited by examiner

HIGH VOLTAGE METAL OXIDE SEMICONDUCTOR DEVICE AND MANUFACTURING METHOD THEREOF

CROSS REFERENCE

The present invention claims priority to Taiwan 106115549, filed on May 11, 2017.

BACKGROUND OF THE INVENTION

Field of Invention

The present invention relates to a high voltage Metal Oxide Semiconductor (MOS) device; particularly it relates to a MOS device having a reduced unit pitch in the layout. The present invention also relates to a manufacturing method of the MOS device.

Description of Related Art

Figure 1A:
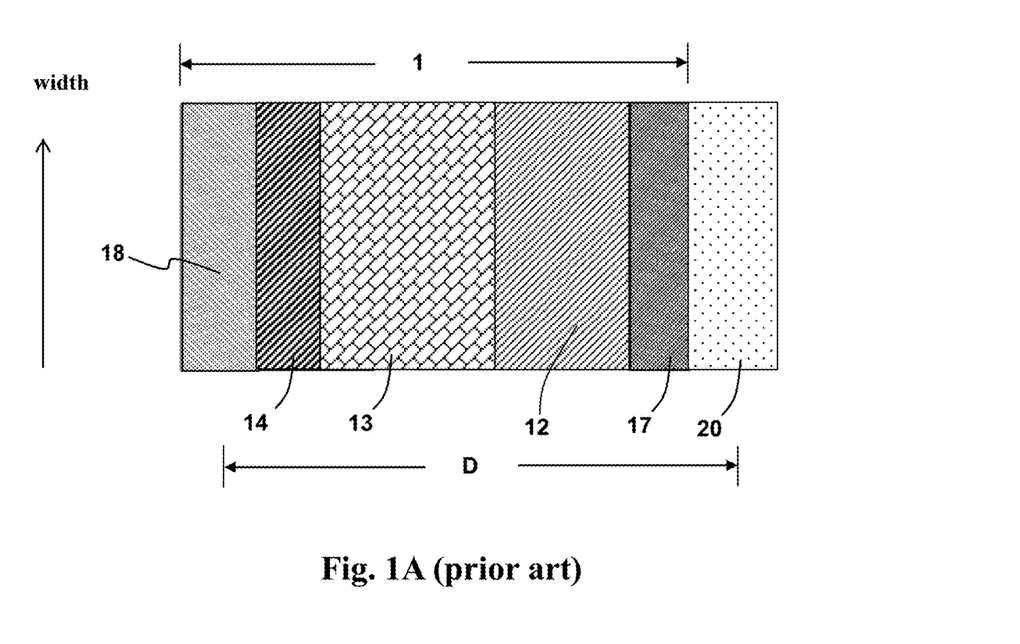
FIGS. 1A and 1B show schematic diagrams of a top view and a cross sectional view of a prior art high voltage MOS device, respectively.
Figure 1B:
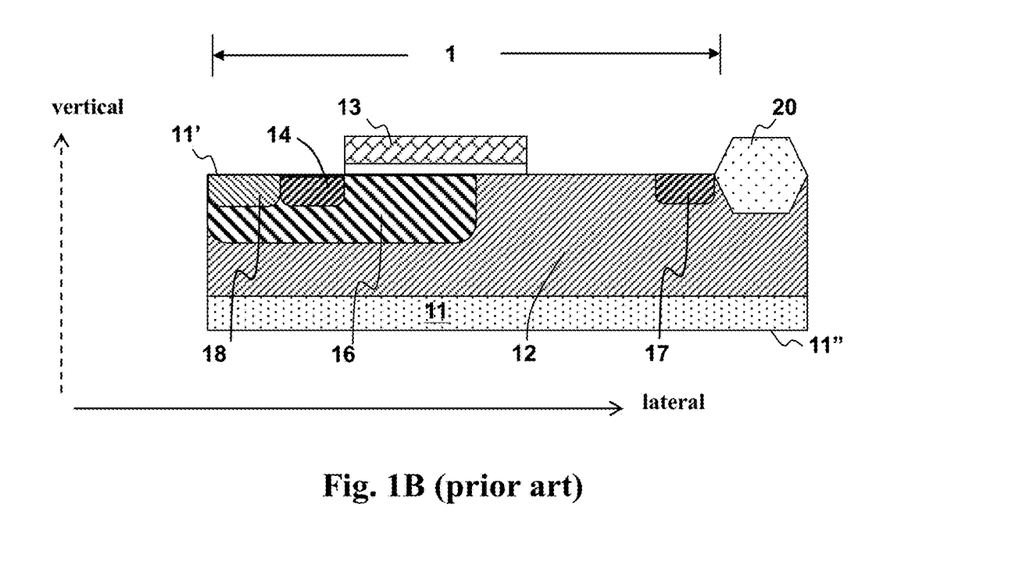

FIGS. 1A and 1B show a top view and a cross sectional view of a prior art high voltage MOS device (N type high voltage MOS device 1) respectively. As shown in FIGS. 1A and 1B, the high voltage MOS device 1 is formed in a semiconductor substrate 11, wherein along the vertical direction, the semiconductor substrate 11 has an upper surface 11' and a bottom surface 11'' opposite to the top surface 11'. The high voltage MOS device 1 comprises an N type well region 12, a P type body region 16, a gate 13, an N type source 14, an N type drain region 17, and a P type body contact region 18. The N type source is formed in the P type body region 16, and the P type body contact region 18 is formed in the P type body region 16. As shown in the figures, the N type source 14 and the P type body contact region 18 are typically parallel to the gate 13 in the width direction, wherein the N type source 14 neighbors the gate 13, and the P type body contact region 18 does or does not contact the N type source 14, and typically does not contact the gate 13.

The prior art shown in in FIGS. 1A and 1B has the following drawback. When plural N type high voltage MOS devices 1 shown in FIGS. 1A and 1B form a switch array (for example, at the left side of the N type MOS device 1 of FIG. 1A, another high voltage MOS device which has the same layout but in a mirrored arrangement as the N type MOS device 1 is formed and connected with the N type MOS device 1 in parallel, and the two devices share the N type source 14 and the P body contact region 18), the unit pitch D of this prior art N type MOS device 1 is large, so the resistance per unit area of the N type high voltage device 1 is large, and therefore the manufacturing cost is high and the device performance is low.

Compared to the prior art of FIGS. 1A and 1B, the high voltage MOS device according to the present invention has a smaller unit pitch, so the resistance per unit area is smaller, or the operating voltage can be higher under the same unit area. Therefore, the present invention has a lower cost, better performance, and broader application range.

SUMMARY OF THE INVENTION

From one perspective, the present invention provides a high voltage metal oxide semiconductor (MOS) device, which is formed in a semiconductor substrate having a top surface and a bottom surface opposite to the top surface in a vertical direction; the high voltage MOS device comprising: a well region with a first conductive type, which is formed in the semiconductor substrate, and is located under the top surface and contacts the top surface in the vertical direction; a body region with a second conductive type, which is formed in the well region, and is located under the top surface and contacts the top surface in the vertical direction; a gate, which is formed on the top surface, wherein in the vertical direction, a portion of the gate is stacked above a portion of the body region; plural source regions with the first conductive type, which are formed in the body region, and are located under the top surface and contact the top surface in the vertical direction, and contact the gate in a lateral direction form a top view perpendicular to the top surface, wherein the plural source regions are separated along the width direction, and any two neighboring source regions do not contact each other in the width direction; a drain region with the first conductive type, which is formed in the well region, and is located under the top surface and contacts the top surface in the vertical direction, and is separated from the source regions by the body region and the well region in the lateral direction; and a body contact region with the second conductive type, which is formed in the body region, and is located under the top surface and contacts the top surface in the vertical direction, and extends along the width direction to overlap with at least two of the source regions, such that the body contact region includes at least a first region and a second region, wherein the first region overlaps at least one of the source regions, and the second region does not overlap any one of the source regions, and in the width direction, the second region contacts the first region, and in the lateral direction, the body contact region does not contact the gate from the top view.

In one embodiment, the high voltage MOS device further includes a field oxide region which is formed on the top surface and is stacked on a portion of the well region, wherein a portion of the gate that is closer to the drain region than the source regions in the lateral direction is stacked above and contacts at least a portion of the field oxide region in the vertical direction.

In one embodiment, the high voltage MOS device further includes a lightly doped diffusion region with the first conductive type, which is formed in the body region, and is located under the top surface and contacts the top surface in the vertical direction, wherein in the width direction, at least a portion of the lightly doped diffusion region is located between two neighboring source regions and contacts the two neighboring source regions, and in the lateral direction, the lightly doped diffusion region is separated from the drain region by the body region and the well region.

From another perspective, the present invention provides a manufacturing method of a high voltage metal oxide semiconductor (MOS) device, comprising: providing a semiconductor substrate having a top surface and a bottom surface opposite to the top surface in a vertical direction; forming a well region with a first conductive type in the semiconductor substrate, wherein the well region is located under the top surface and contacts the top surface in the vertical direction; forming a body region with a second conductive type in the well region, wherein the body region is located under the top surface and contacts the top surface in the vertical direction; forming a gate on the top surface, wherein in the vertical direction, a portion of the gate is stacked above a portion of the body region; forming plural source regions with the first conductive type in the body region, wherein the plural source regions are located under the top surface and contact the top surface in the vertical direction, and contact the gate in a lateral direction form a top view perpendicular to the top surface, wherein the plural source regions are separated along the width direction, and any two neighboring source regions do not contact each other in the width direction; forming a drain region with the first conductive type in the well region, wherein the drain region is located under the top surface and contacts the top surface in the vertical direction, and is separated from the source regions by the body region and the well region in the lateral direction; and forming a body contact region with the second conductive type in the body region, wherein the body contact region is located under the top surface and contacts the top surface in the vertical direction, and extends along the width direction to overlap with at least two of the source regions, such that the body contact region includes at least a first region and a second region, wherein the first region overlaps at least one of the source regions, and the second region does not overlap any one of the source regions, and in the width direction, the second region contacts the first region, and in the lateral direction, the body contact region does not contact the gate from the top view.

In one embodiment, the manufacturing method further includes: forming a field oxide region on the top surface, wherein the field oxide region is stacked on a portion of the well region, and a portion of the gate that is closer to the drain region than the source regions in the lateral direction is stacked above and contacts at least a portion of the field oxide region in the vertical direction.

In one embodiment, the manufacturing method of further includes: forming a lightly doped diffusion region with the first conductive type in the body region, wherein the lightly doped diffusion region is located under the top surface and contacts the top surface in the vertical direction, and in the width direction, at least a portion of the lightly doped diffusion region is located between two neighboring source regions and contacts the two neighboring source regions, and in the lateral direction, the lightly doped diffusion region is separated from the drain region by the body region and the well region.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 2A:
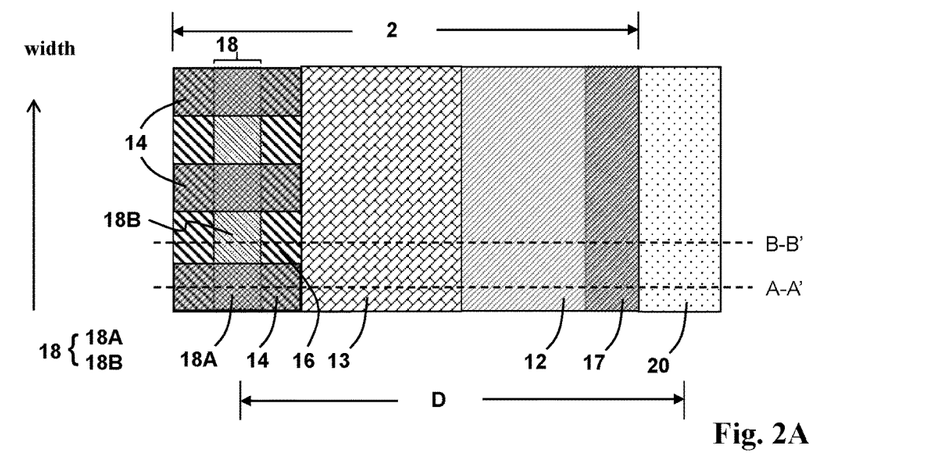
FIGS. 2A, 2B and 2C show schematic diagrams of a top view and two cross sectional views of an embodiment of the high voltage MOS device according to the present invention, respectively.
Figure 2B:
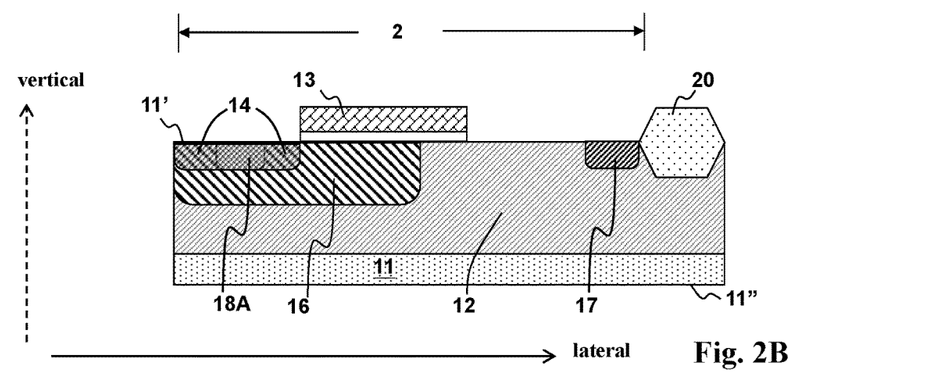
Figure 2C:
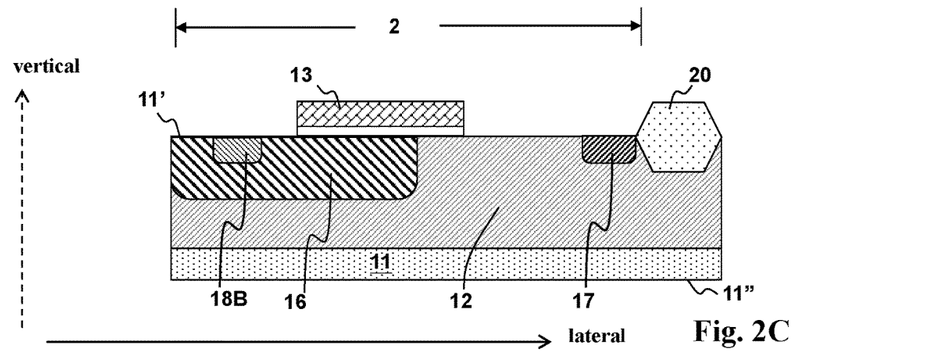

FIGS. 2A, 2B and 2C show schematic diagrams of an embodiment of the high voltage MOS device (high voltage MOS device 2) according to the present invention, by a top view (FIG. 2A), a first cross sectional view (i.e. FIG. 2B which corresponds to line A-A' in FIG. 2A) and a second cross sectional view (i.e. FIG. 2C which corresponds to line B-B' in FIG. 2A), respectively. As shown in the figures, the high voltage MOS device 2 is formed in a semiconductor substrate 11 which includes a top surface 11' and a bottom surface 11" opposite to the top surface 11' in a vertical direction (as indicated by the dashed arrow shown in FIG. 2B or 2C). The high voltage MOS device 2 comprises a well region 12 with a first conductive type, a body region 16 with a second conductive type, a gate 13, plural source regions 14 with the first conductive type, a drain region 17 with the first conductive type, and a body contact regions 18 with the second conductive type.

Still referring to FIGS. 2A, 2B and 2C, the well region 12 is formed in the semiconductor substrate 11, and is located under the top surface 11' and contacts the top surface 11' in the vertical direction. The body region 16 is formed in the well region 12, and is located under the top surface 11' and contacts the top surface 11' in the vertical direction. The gate 13 (including a gate electrode layer and a gate dielectric layer) is formed on the top surface 11', wherein in the vertical direction, a portion of the gate 13 is stacked above a portion of the body region 16. The channel region of the high voltage MOS device 2 is the area where the gate 13 overlaps the body region 16 from top view. The plural source regions 14 are formed in the body region 16, and are located under the top surface 11' and contact the top surface 11' in the vertical direction, and neighbors the gate 13 in a lateral direction (as indicated by the solid arrow noted "lateral" in FIGS. 2B and 2C). The plural source regions 14 are arranged substantially in parallel along a width direction (as indicated by the arrow noted "width" in FIG. 2A), wherein any two neighboring source regions 14 are at least partially separated from each other in the width direction, that is, any two neighboring source regions 14 do not fully contact each other. In one preferred embodiment as shown in FIG. 2A, any two neighboring source regions 14 are fully separated from each other in the width direction. In another embodiment, any two neighboring source regions 14 can be partially separated from each other in the width direction.

Still referring to FIGS. 2A, 2B and 2C, the drain region 17 is formed in the well region 12, and is located under the top surface 11' and contacts the top surface 11' in the vertical direction, and is separated from the source regions 14 by the body region 16 and the well region 12 in the lateral direction, and is separated from the body region 16 by the well region 12 in the lateral direction. The body contact region 18 is formed in the body region 16, and is located under the top surface 11' and contacts the top surface 11' in the vertical direction, and extends along the width direction to overlap with at least two of the source regions 14, such that the body contact region 18 includes at least a first region 18A and a second region 18B, wherein the first region 18A overlaps at least one of the source regions 14 (as shown in FIGS. 2A and 2B), and the second region 18B does not overlap any one of the source regions 14 (as shown in FIGS. 2A and 2C), and in the width direction, the second region 18B contacts the first region 18A, and in the lateral direction, the body contact region 18 does not contact nor overlap the gate 13 from top view. In one preferred embodiment, as shown in FIG. 2A, the body contact region 18 forms a rectangle shape which extends substantially in parallel to the gate 13 along the width direction.

The "first conductive type" and the "second conductive type" indicate impurities of different conductive types doped into regions such as the aforementioned well region, body region, body contact region, source, drain region and gate; the first conductive type is for example N type and the second conductive type is for example P type, or the opposite.

The term "high voltage" MOS device indicates that the voltage applied on the drain region is higher than a certain level such as 5V or higher. In this embodiment, the drain region 17 is separated from the channel region by the well region 12, and the lateral distance from the drain region 17 to the body region 16 (where the channel region exists) can be adjusted depending on the operating voltage required for the high voltage MOS device to operate with.

Note that the present invention is advantageous over the prior art in that the unit pitch in layout can be smaller. Taking the high voltage MOS device 2 as an example, according to the present invention, there is no alignment concern between the source regions 14 and the body contact region 18 along the same direction (i.e. the width direction and the lateral direction), and therefore it is not required to increase the unit pitch D for tolerating the alignment error between the source regions 14 and the body contact region 18. Besides, in one embodiment, when plural high voltage MOS devices of the present invention (e.g. the high voltage MOS 2) form a switch array, (for example, at the left side of the N type MOS device 2 of FIG. 2A, another high voltage MOS device which has the same layout but in a mirrored arrangement as the N type MOS device 2 is formed and connected with the N type MOS device 2 in parallel, and the two devices share the N type sources 14 and the P body contact region 18), the unit pitch D of the present invention is lower compared to the prior art due to the substantial parallel arrangement of the plural source regions 14 along the width direction, whereby the resistance per unit area of the N type high voltage device 2 of the present invention is lower, and therefore the manufacturing cost is lower and the device performance is higher. And, that the body contact region 18 is arranged as shown in FIGS. 2A-2C can restrict the negative effect of the arrangement of the plural source regions 14 on the effective channel width of the high voltage MOS device 2, so the effective channel width of the high voltage MOS device 2 will not be affected too much, that is, the overall resistance per unit area of the N type high voltage device 2 is still lower than the prior art. In one embodiment, the left side of the high voltage MOS device 2 shown in FIG. 2A may be a field oxide region, and the high voltage MOS device 2 shown in FIG. 2A does not share the source regions and the body contact region with another MOS device.

Figure 3A:
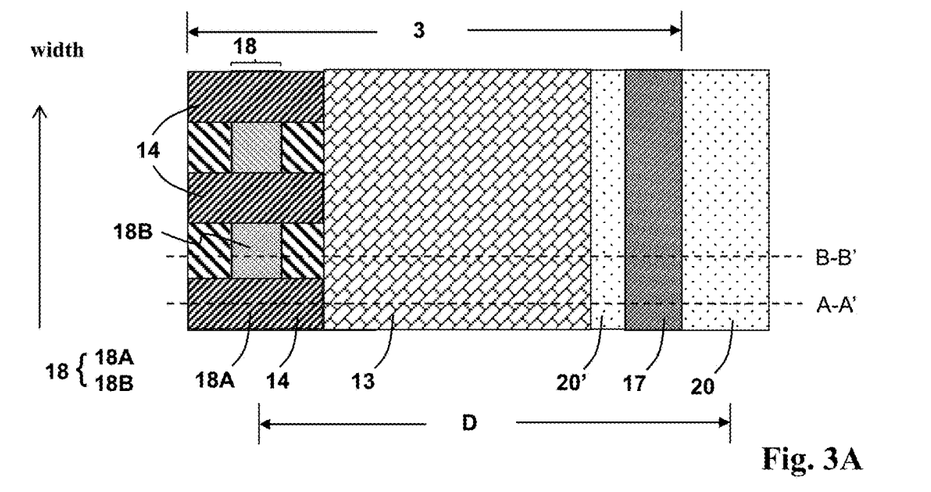
FIGS. 3A, 3B and 3C show schematic diagrams of a top view and two cross sectional views of an embodiment of the high voltage MOS device according to the present invention, respectively.
Figure 3B:
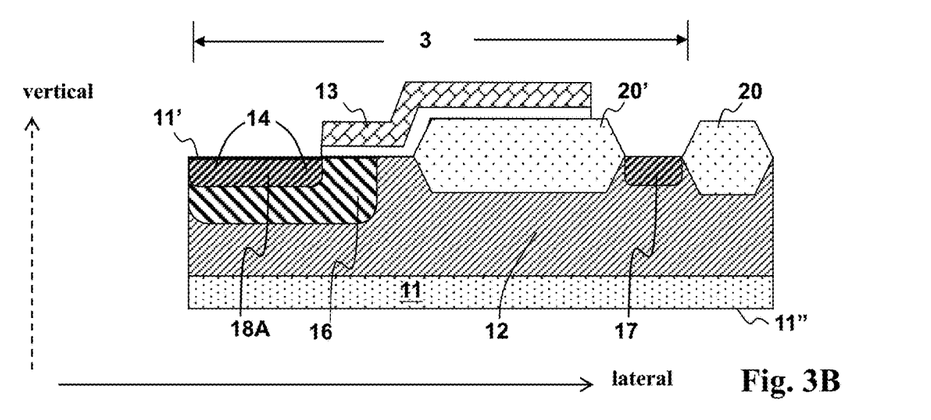
Figure 3C:
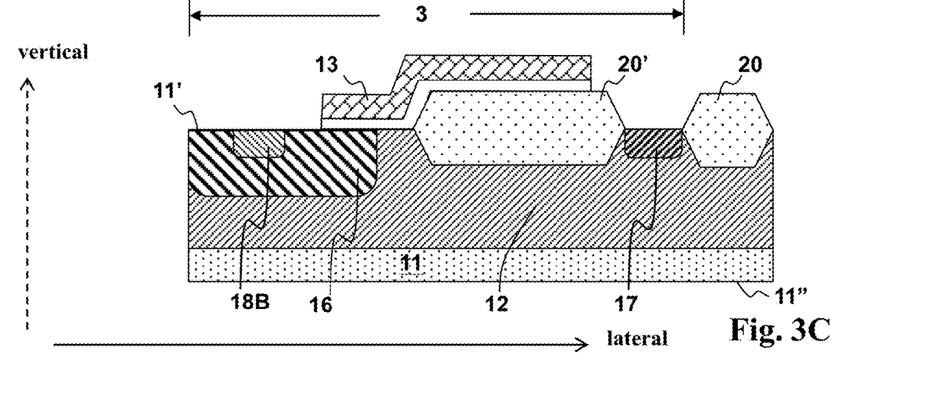

FIGS. 3A, 3B and 3C show schematic diagrams of an embodiment of the high voltage MOS device (high voltage MOS device 3) according to the present invention, by a top view (FIG. 3A), a first corresponding cross sectional view (i.e. FIG. 3B which corresponds to line A-A' in FIG. 3A) and a second corresponding cross sectional view (i.e. FIG. 3C which corresponds to line B-B' in FIG. 3A) respectively. The high voltage MOS device 3 is similar to the high voltage MOS device 2, but is different in that in this embodiment, the high voltage MOS device 3 further includes a field oxide region 20' which is formed on the top surface 11' and is stacked on a portion of the well region 12, wherein a portion of the gate 13 that is closer to the drain region 17 than the source regions 14 in the lateral direction is stacked above and contacts at least a portion of the field oxide region 20' in the vertical direction. In this embodiment, a portion of the gate 13 that is closer to the drain region 17 than the source regions 14 is stacked above and contacts the whole of the field oxide region 20' in the vertical direction. This embodiment illustrates that under the the teaching by the present invention, the high voltage MOS device of the present invention can be modified to be applied to various different types of high voltage devices such as one with the field oxide region 20'. Since the high voltage MOS device 3 includes the field oxide region 20', the operating voltage can be higher. Besides, the field oxide region 20' is not limited to the local oxidation of silicon (LOCOS) structure as shown in the figure, and may be embodied with a shallow trench isolation (STI) structure.

Figure 4A:
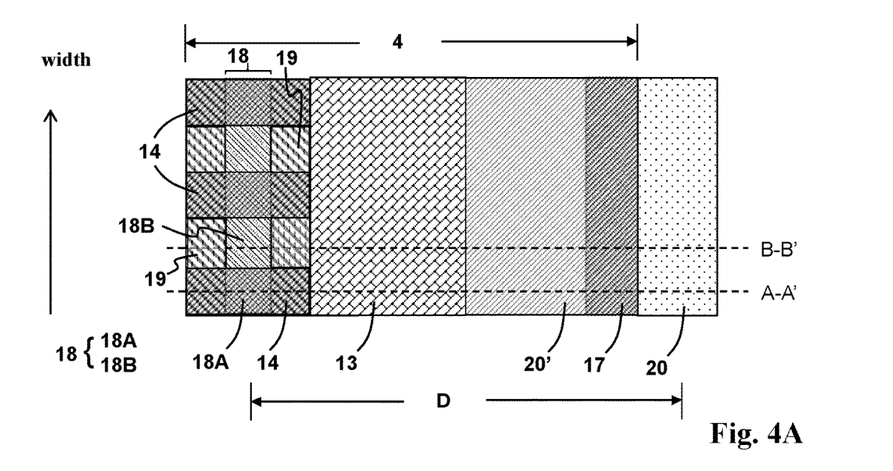
FIGS. 4A, 4B and 4C show schematic diagrams of a top view and two cross sectional views of an embodiment of the high voltage MOS device according to the present invention, respectively.
Figure 4B:
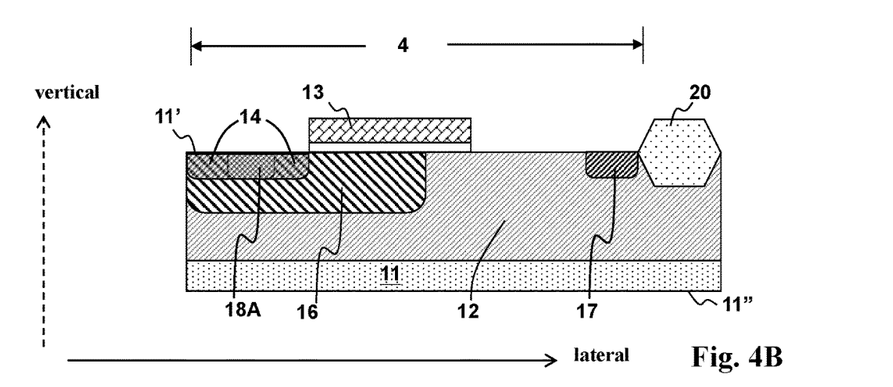
Figure 4C:
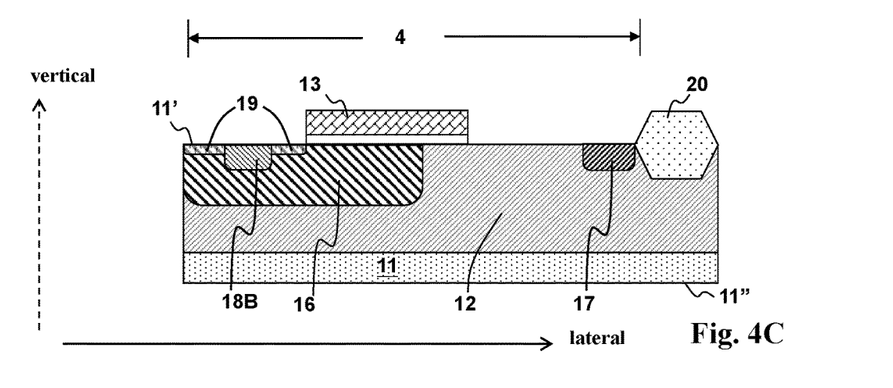
Figure 4D:
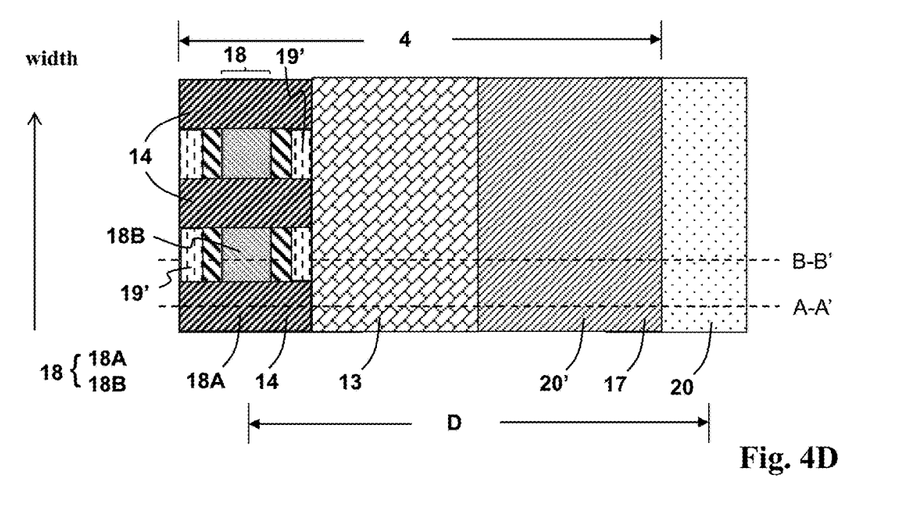
FIG. 4D shows a schematic diagram of a top view of an embodiment of the high voltage MOS device according to the present invention.

FIGS. 4A, 4B and 4C show schematic diagrams of an embodiment of the high voltage MOS device (high voltage MOS device 4) according to the present invention, by a top view (FIG. 4A), a first corresponding cross sectional view (i.e. FIG. 4B which corresponds to line A-A' in FIG. 4A) and a second corresponding cross sectional view (i.e. FIG. 4C which corresponds to line B-B' in FIG. 4A) respectively. The high voltage MOS device 4 is similar to the high voltage MOS device 2, but is different in that in this embodiment, the high voltage MOS device 4 further includes a lightly doped diffusion region 19 with the first conductive type. The lightly doped diffusion region 19 is formed in the body region 16, and is located under the top surface 11' and contacts the top surface 11' in the vertical direction. In the width direction, at least a portion of the lightly doped diffusion region 19 is located between two neighboring source regions 14 and contacts the two neighboring source regions 14. In the lateral direction, the lightly doped diffusion region 19 contacts the gate 13 from top view (as shown in FIG. 4C), and is separated from the drain region 17 by the body region 16 and the well region 12. In one embodiment, the lightly doped diffusion region 19 fully overlaps the area between two neighboring source regions 14 that is not occupied by the body contact region 18, for example as shown by the lightly doped diffusion region 19 in FIG. 4A. In another embodiment, the lightly doped diffusion region 19 partially overlaps the area between two neighboring source regions 14 that is not occupied by the body contact region 18, for example as shown by the lightly doped diffusion region 19' in FIG. 4D.

When the plural source regions 14 are arranged according to the present invention as described hereinbefore, forming the lightly doped diffusion region 19 between two neighboring source regions 14 provides an effect that the effective channel width of the high voltage MOS device 4 can be further increased, whereby the resistance per unit area can be further reduced.

Figure 5A:
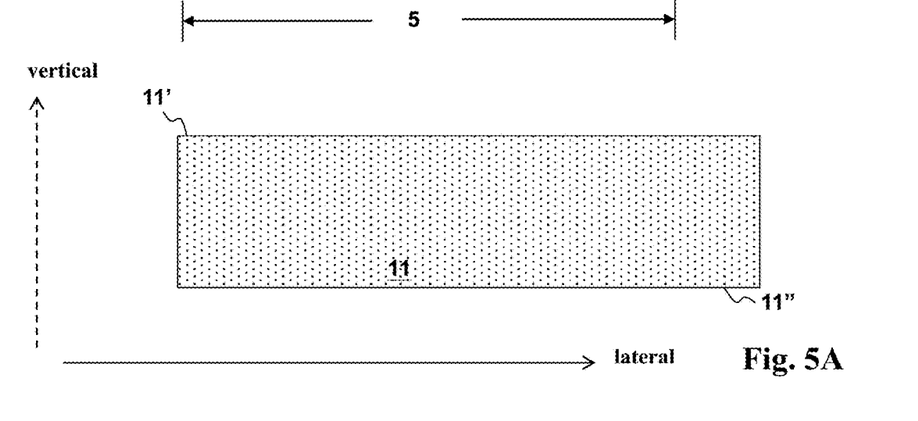
FIGS. 5A-5G" show schematic top views and cross sectional views to illustrate a manufacturing method of the high voltage MOS device according to the present invention.
Figure 5B:
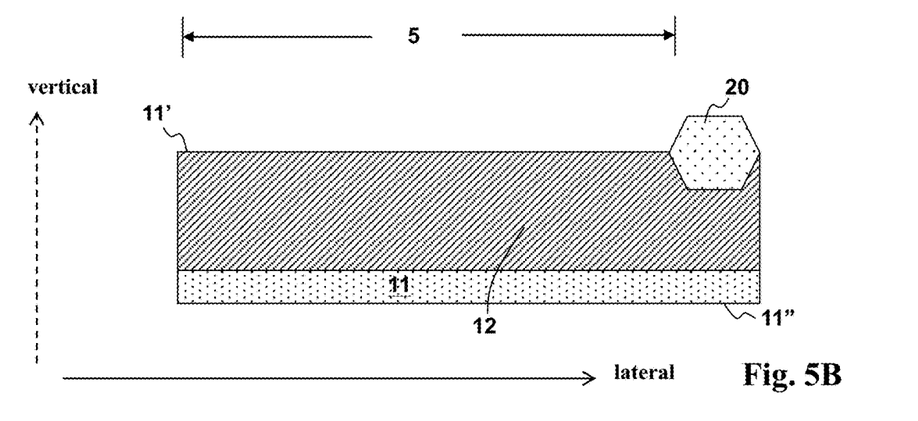

FIGS. 5A-5G" show schematic diagrams, in top view and corresponding cross sectional views, of a manufacturing method of the high voltage MOS device (high voltage MOS device 5) according to the present invention. First, as shown in FIG. 5A, a semiconductor substrate 11 is provided, wherein the semiconductor substrate 11 is for example but not limited to a P type silicon substrate, but certainly it may be other types of semiconductor substrate. The semiconductor substrate 11 includes a top surface 11' and a bottom surface 11" opposite to the top surface 11' in a vertical direction (as indicated by the dashed arrow as shown in the figure). Next, as shown in FIG. 5B, a well region 12 with a first conductive type is formed in the semiconductor substrate 11. The well region 12 is located under the top surface 11' and contacts the top surface 11' in the vertical direction.

The well region 12 may be formed by for example but not limited to lithography, ion implantation, and thermal process steps. Next, a field oxide region 20 is formed to define an active region of the high voltage MOS device 5.

Figure 5C:
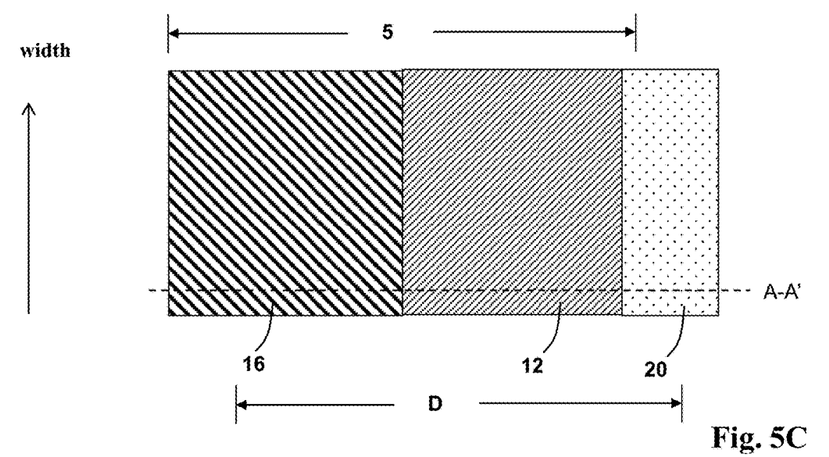

FIGS. 5C and 5C' are a top view (FIG. 5C), a corresponding cross sectional view (FIG. 5C', which corresponds to the cross section line A-A' in FIG. 5C) respectively. As shown in the figures, next, a photoresist layer 21 is formed to define an ion implantation region for the body region 16. An ion implantation process is performed to implant impurities with the second conductive type into the defined region to form the body region 16 in the well region 12, wherein the body region 16 is located under the top surface 11' and contacts the top surface 11' in the vertical direction.

Figure 5D:
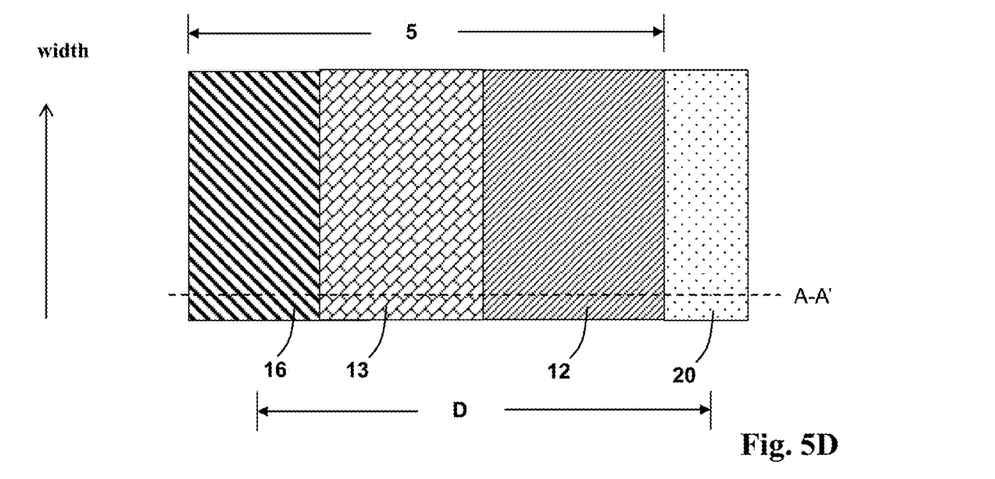

FIGS. 5D and 5D' are a top view (FIG. 5D), a corresponding cross sectional view (FIG. 5D', which corresponds to the cross section line A-A' in FIG. 5D) respectively. As shown in the figures, next, a gate 13 (including a gate electrode layer and a gate dielectric layer) is formed and stacked on the top surface 11', wherein in the vertical direction, a portion of the gate 13 is stacked above a portion of the body region 16.

Figure 5E:
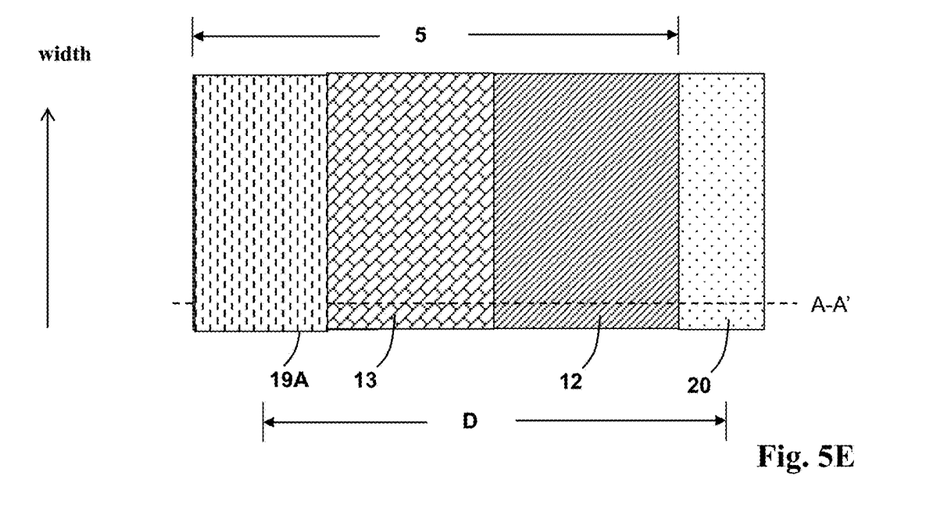

FIGS. 5E and 5E' are a top view (FIG. 5E), a corresponding cross sectional view (FIG. 5E', which corresponds to the cross section line A-A' in FIG. 5E) respectively. As shown in the figures, next, an ion implantation region for the lightly doped diffusion definition region 19A is defined by the gate 13, the field oxide region 20, and a photoresist layer 21a. An ion implantation process is performed to implant impurities with the first conductive type into the defined region to form the lightly doped diffusion definition region 19A in the body region 16, wherein the lightly doped diffusion definition region 19A is located under the top surface 11' and contacts the top surface 11' in the vertical direction. The lightly doped diffusion definition region 19A is for forming the lightly doped diffusion region 19, which will be described in detail later.

Figure 5F:
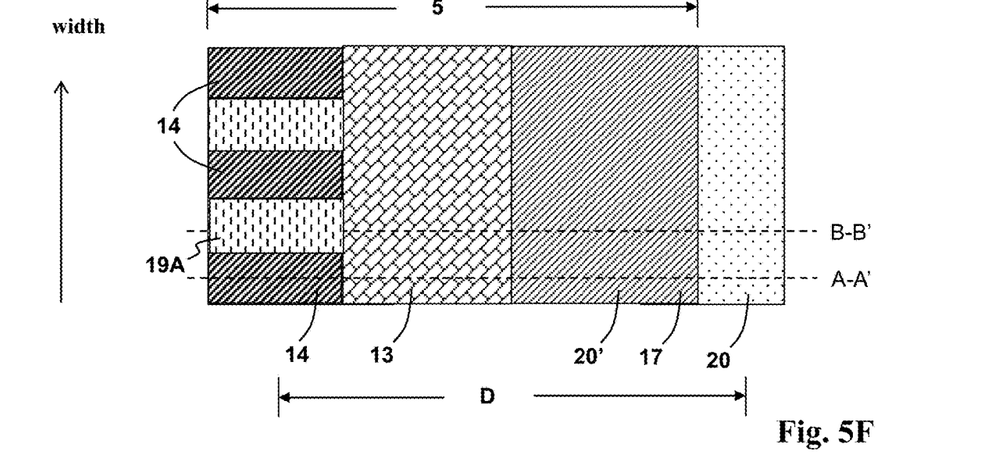

FIGS. 5F, 5F' and 5F" are a top view (FIG. 5F), a first corresponding cross sectional view (FIG. 5F', which corresponds to the cross section line A-A' in FIG. 5F) and a second corresponding cross sectional view (FIG. 5F", which corresponds to the cross section line B-B' in FIG. 5F) respectively. As shown in the figures, next, ion implantation regions of plural source regions 14 and a drain region 17 are defined by the gate 13, the field oxide region 20, and a photoresist layer 21b. An ion implantation process is performed to implant impurities with the first conductive type into the defined regions to form the plural source regions 14 in the body region 16 and to form the drain region 17 in the well region 12. The plural source regions 14 are separated and arranged substantially in parallel along the width direction. As shown in FIGS. 5F and 5F", in one preferred embodiment, any two neighboring source regions 14 are separated from each other in the width direction, that is, any two neighboring source regions 14 do not contact each other. The drain region 17 is located under the top surface 11' and contacts the top surface 11' in the vertical direction, and is separated from the source regions 14 by the body region 16 and the well region 12 in the lateral direction.

Figure 5G:
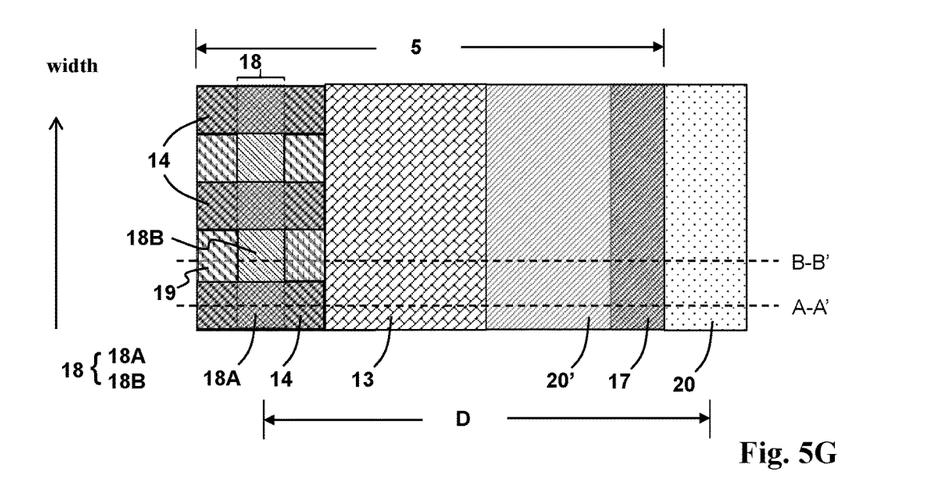

As shown in FIGS. 5G, 5G' and 5G", next, an ion implantation region for the body contact region 18 is defined by a photoresist layer 21c. An ion implantation process is performed to implant impurities with the second conductive type into the defined region to form the body contact region 18 in the body region 16, wherein the body contact region 18 is located under the top surface 11' and contacts the top surface 11' in the vertical direction, and extends along the width direction to overlap with at least two of the source regions 14, such that the body contact region 18 includes at least a first region 18A and a second region 18B, wherein the first region 18A overlaps at least one of the source regions 14 (as shown in FIGS. 5G and 5G'), and the second region 18B does not overlap any one of the source regions 14 (as shown in FIGS. 5G and 5G"), and in the width direction, the second region 18B contacts the first region 18A, and in the lateral direction, the body contact region 18 does not contact nor overlap the gate 13 from top view. In one preferred embodiment, as shown in FIG. 5G, the body contact region 18 forms a rectangle shape which extends substantially in parallel to the gate 13 along the width direction.

Note that in one embodiment, the impurity doping densities of the source regions 14 and the body contact region 18 are far higher than that of the lightly doped diffusion definition region 19A, and therefore after the steps shown in FIGS. 5G, 5G' and 5G", the lightly doped diffusion definition region 19A will form the lightly doped diffusion region 19 shown FIGS. 5G, 5G' and 5G". And in the width direction, at least a portion of the lightly doped diffusion region 19 is located between two neighboring source regions 14 and contacts the two neighboring source regions 14, that is, the lightly doped diffusion region 19 connects the two neighboring source regions 14. In the lateral direction, the lightly doped diffusion region 19 contacts the gate 13 from top view (as shown in FIGS. 5G and 5G"), and is separated from the drain region 17 by the body region 16 and the well region 12 (as shown in FIG. 5G"). In one embodiment, the lightly doped diffusion region 19 fully overlaps the area between two neighboring source regions 14 that is not occupied by the body contact region 18, for example as shown by the lightly doped diffusion region 19 in FIG. 5G.

In one embodiment, the lightly doped diffusion region 19 of the high voltage MOS device 4 shown in FIGS. 4A-4C may be omitted, and in this case the step of forming the lightly doped diffusion definition region 19A shown in FIG. 5E may also be omitted, and consequently the lightly doped diffusion definition region 19A and the lightly doped diffusion region 19 in FIGS. 5F, 5F', 5F", 5G, 5G', and 5G" can be omitted; a manufacturing process without the aforementioned omitted steps will form the high voltage MOS device 2 shown in FIGS. 2A-2C. In one embodiment, the lightly doped diffusion region 19 may be formed in the step shown in 5E-5E" directly by a photoresist layer defining an ion implantation region. In this case, the lightly doped diffusion definition region 19A is substantially the same as the lightly doped diffusion region 19.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. As an example, the "field oxide region 20" of the high voltage MOS device 3 and the "lightly doped diffusion region 19 of the high voltage MOS device 4 can be embodied together so that the high voltage MOS with these two regions can include characteristics provided by these two regions. Furthermore, those skilled in this art can readily conceive variations and modifications within the spirit of the present invention. For example, other process steps or structures which do not affect the primary characteristic of the device, such as a threshold voltage adjustment region, or a buried layer, and etc., can be added; for another example, the lithography step described in the above can be replaced by electron beam lithography or other lithography techniques. In view of the foregoing, the spirit of the present invention should cover all such and other modifications and variations, which should be interpreted to fall within the scope of the following claims and their equivalents.

What is claimed is:

1. A high voltage metal oxide semiconductor (MOS) device, which is formed in a semiconductor substrate having a top surface and a bottom surface opposite to the top surface in a vertical direction; the high voltage MOS device comprising:
   a well region with a first conductive type, which is formed in the semiconductor substrate, and is located under the top surface and contacts the top surface in the vertical direction;
   a body region with a second conductive type, which is formed in the well region, and is located under the top surface and contacts the top surface in the vertical direction;
   a gate, which is formed on the top surface, wherein in the vertical direction, a portion of the gate is stacked above a portion of the body region;
   plural source regions with the first conductive type, which are formed in the body region, and are located under the top surface and contact the top surface in the vertical direction, and contact the gate in a lateral direction form a top view perpendicular to the top surface, wherein the plural source regions are separated along the width direction, and any two neighboring source regions do not contact each other in the width direction;
   a drain region with the first conductive type, which is formed in the well region, and is located under the top surface and contacts the top surface in the vertical direction, and is separated from the source regions by the body region and the well region in the lateral direction; and
   a body contact region with the second conductive type, which is formed in the body region, and is located under the top surface and contacts the top surface in the vertical direction, and extends along the width direction to overlap with at least two of the source regions, such that the body contact region includes at least a first region and a second region, wherein the first region overlaps at least one of the source regions, and the second region does not overlap any one of the source regions, and in the width direction, the second region contacts the first region, and in the lateral direction, the body contact region does not contact the gate from the top view.

2. The high voltage MOS device of claim 1, further including a field oxide region which is formed on the top surface and is stacked on a portion of the well region, wherein a portion of the gate that is closer to the drain region than the source regions in the lateral direction is stacked above and contacts at least a portion of the field oxide region in the vertical direction.

3. The high voltage MOS device of claim 1, further including a lightly doped diffusion region with the first conductive type, which is formed in the body region, and is located under the top surface and contacts the top surface in the vertical direction, wherein in the width direction, at least a portion of the lightly doped diffusion region is located between two neighboring source regions and contacts the two neighboring source regions, and in the lateral direction, the lightly doped diffusion region is separated from the drain region by the body region and the well region.

4. A manufacturing method of a high voltage metal oxide semiconductor (MOS) device, comprising:
   providing a semiconductor substrate having a top surface and a bottom surface opposite to the top surface in a vertical direction;
   forming a well region with a first conductive type in the semiconductor substrate, wherein the well region is located under the top surface and contacts the top surface in the vertical direction;
   forming a body region with a second conductive type in the well region, wherein the body region is located under the top surface and contacts the top surface in the vertical direction;
   forming a gate on the top surface, wherein in the vertical direction, a portion of the gate is stacked above a portion of the body region;
   forming plural source regions with the first conductive type in the body region, wherein the plural source regions are located under the top surface and contact the top surface in the vertical direction, and contact the gate in a lateral direction form a top view perpendicular to the top surface, wherein the plural source regions are separated along the width direction, and any two neighboring source regions do not contact each other in the width direction;
   forming a drain region with the first conductive type in the well region, wherein the drain region is located under the top surface and contacts the top surface in the vertical direction, and is separated from the source regions by the body region and the well region in the lateral direction; and
   forming a body contact region with the second conductive type in the body region, wherein the body contact region is located under the top surface and contacts the top surface in the vertical direction, and extends along the width direction to overlap with at least two of the source regions, such that the body contact region includes at least a first region and a second region, wherein the first region overlaps at least one of the source regions, and the second region does not overlap any one of the source regions, and in the width direction, the second region contacts the first region, and in the lateral direction, the body contact region does not contact the gate from the top view.

5. The manufacturing method of claim 4, further including: forming a field oxide region on the top surface, wherein the field oxide region is stacked on a portion of the well region, and a portion of the gate that is closer to the drain region than the source regions in the lateral direction is stacked above and contacts at least a portion of the field oxide region in the vertical direction.

6. The manufacturing method of claim 4, further including: forming a lightly doped diffusion region with the first conductive type in the body region, wherein the lightly doped diffusion region is located under the top surface and contacts the top surface in the vertical direction, and in the width direction, at least a portion of the lightly doped diffusion region is located between two neighboring source regions and contacts the two neighboring source regions, and in the lateral direction, the lightly doped diffusion region is separated from the drain region by the body region and the well region.

* * * * *